(12) United States Patent
Choi et al.

(10) Patent No.: US 9,461,098 B2
(45) Date of Patent: Oct. 4, 2016

(54) ORGANIC LIGHT EMITTING DISPLAY DEVICE

(71) Applicant: LG Display Co., Ltd., Seoul (KR)

(72) Inventors: Dae Jung Choi, Paju-si (KR); Jae Ki Lee, Paju-si (KR); Ki Soub Yang, Paju-si (KR); Hong Myeong Jeon, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/581,158

(22) Filed: Dec. 23, 2014

(65) Prior Publication Data

US 2016/0079323 A1 Mar. 17, 2016

(30) Foreign Application Priority Data

Sep. 16, 2014 (KR) .................. 10-2014-0122527

(51) Int. Cl.
*H01L 51/40* (2006.01)
*H01L 27/32* (2006.01)

(52) U.S. Cl.
CPC ................. *H01L 27/3246* (2013.01)

(58) Field of Classification Search
CPC ........... H01L 27/3223; H01L 27/3244; H01L 27/3246; H01L 2227/323; H01L 51/0005; H01J 1/62; H01J 9/00
See application file for complete search history.

(56) References Cited

U.S. PATENT DOCUMENTS

| | | | |
|---|---|---|---|
| 2003/0156079 A1* | 8/2003 | Nakanishi | G09G 3/3233 345/45 |
| 2009/0128020 A1* | 5/2009 | Takei | H01L 27/3223 313/504 |
| 2010/0066240 A1* | 3/2010 | Park | H01L 27/3246 313/504 |

FOREIGN PATENT DOCUMENTS

| | | |
|---|---|---|
| JP | 2005-259718 A | 9/2005 |
| JP | 2010-73602 A | 4/2010 |
| WO | 2013/002321 A1 | 1/2013 |

* cited by examiner

*Primary Examiner* — Charles Garber
*Assistant Examiner* — Abdulfattah Mustapha
(74) *Attorney, Agent, or Firm* — Dentons US LLP

(57) ABSTRACT

An OLED device is disclosed. The device includes a substrate defined to have a first active area and a dummy area. First electrodes are formed on the substrate, and a first bank pattern is formed to overlap with edges of each first electrode and to expose a part of an upper surface of each first electrode. A second bank pattern is formed on the first bank pattern within the first active area, and a third bank pattern is formed on the first bank pattern within the dummy area in the same layer as the second bank pattern. The second bank pattern is formed to have a larger width than that of the third bank pattern. As such, an organic emission layer can be evenly formed in the active area.

14 Claims, 5 Drawing Sheets

ORGANIC LIGHT EMITTING DISPLAY DEVICE

The present application claims priority under 35 U.S.C. §119(a) of Korean Patent Application No. 10-2014-0122527 filed on Sep. 16, 2014 which is hereby incorporated by reference for all purposes in its entirety.

BACKGROUND

1. Field of the Disclosure

The present application relates to an organic light emitting display (OLED) device. More particularly, the present application relates to an OLED device adapted to enhance luminous images.

2. Description of the Related Art

Recently, a variety of flat panel display devices with reduced weight and volume corresponding to disadvantages of cathode ray tubes (CRTs) are being developed. The flat panel display devices include liquid crystal display (LCD) devices, field emission display (FED) devices, plasma display panels (PDPs), electroluminescence (EL) devices and so on.

The electroluminescence devices are classified into an inorganic light emitting display device and an OLED device on the basis of the formation material of an emission layer. Such electroluminescence devices have features such as high response time, high light emission efficiency, high brightness and wide viewing angle because of using self-illuminating elements.

The OLED device corresponding to one of the electroluminescence devices has features of high brightness and a low driving voltage. Also, the OLED device being a cell-luminous device can have a high contrast ratio and realize a large-sized thin display screen. Moreover, the OLED device is easy to realize motion images because of its response time of several micro-seconds (μs). Furthermore, the OLED device is not limited to the viewing angle, and maintains a stable state at a low temperature.

The OLED device includes array elements and organic light emitting diodes (or elements). The array element includes a switching thin film transistor connected to a gate line and a data line, and a driving transistor connected to the respective organic light emitting diode. The organic light emitting diode includes a firs electrode connected to the driving thin film transistor, and an organic emission layer and a second electrode stacked on the first electrode.

In an ordinary OLED device, the organic emission layer is generally formed through a thermal evaporation process using a shadow mask. A recently large-sized display device forces the shadow mask to severely sag. The sagging shadow mask causes depositing faults of the organic emission layer to be generated. Due to this, it is difficult to apply the shadow mask to a large-sized substrate.

In order to solve this problem, a print method using one of an ink-jet apparatus and a nozzle coating apparatus is proposed. The print method jets or injects a liquefied organic emission material into openings (or regions), which are defined by a bank pattern, using one of the ink-jet apparatus and the nozzle coating apparatus. The organic emission material must be ununiformly coated. Actually, the organic emission material starts to harden from the central region of the opening, and is solidified at a relatively slow speed in the central region of the opening compared to the edge regions of the opening and adjacent to the bank pattern. This phenomenon enables the organic emission material to harden in a state that a part of the organic emission material internally flows from the central region of the opening to the edge regions of the opening. In accordance therewith, the organic emission material is formed thicker in edge regions of the opening adjacent to the bank pattern, compared to the central region of the opening.

Due to this, an organic emission layer cannot have a planarized surface. Also, a part of the organic emission layer is formed thicker and developed darker than the other portion. The darkly developed portion is viewed to users like a stain. As such, the thick portion of the organic emission layer is treated in such a manner as to be not included a substantial emission region and viewed to users. This treatment of the organic emission layer deteriorates the aperture ratio of the OLED device, To address this matter, a double layered bank pattern formation method is proposed which allows the entire surface of the organic emission layer including edges of the organic emission layer adjacent to the bank pattern to be planarized. The double layered bank pattern formation method forms a first bank pattern and a second bank pattern on the first bank pattern. However, although the double layered bank pattern is formed, the organic emission layer is formed thicker in edges of an active area compared to the central portion of the active area.

BRIEF SUMMARY

Accordingly, embodiments of the present application are directed to an OLED device that substantially obviates one or more of problems due to the limitations and disadvantages of the related art.

The embodiments provide an OLED device which is adapted to planarize an organic emission layer by enabling a second bank pattern on a first active region to be formed wider than a third bank pattern on one of a second active region and a dummy region in width.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

An organic light emitting display (OLED) device according to a general aspect of the present embodiment includes a substrate defined to have a first active area and a dummy area. First electrodes are formed on the substrate, and a first bank pattern is formed to overlap with edges of each first electrode and to expose a part of an upper surface of each first electrode. A second bank pattern is formed on the first bank pattern within the first active area, and a third bank pattern is formed on the first bank pattern within the dummy area in the same layer as the second bank pattern. Also, a first organic emission layer is formed on the exposed upper surface of the first electrode within the first active area, and a second organic emission layer is formed on the exposed surfaces of the first electrode within the dummy area, wherein the second organic emission layer covers a larger area of the first electrode than the first organic emission layer.

The second bank pattern is formed to have a larger width than that of the third bank pattern. As such, the first organic emission layer within the active area is evenly formed.

An OLED device according to another general aspect of the present embodiment includes: a substrate defined to have an active area and a dummy area; a first bank pattern formed on the substrate; a second bank pattern formed on the first bank pattern and configured to define an opening in the active area; a third bank pattern formed on the first bank pattern and configured to define another opening in the dummy area; an organic emission layer formed in the openings. The opening of the active area has a smaller size than the opening of the dummy area.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
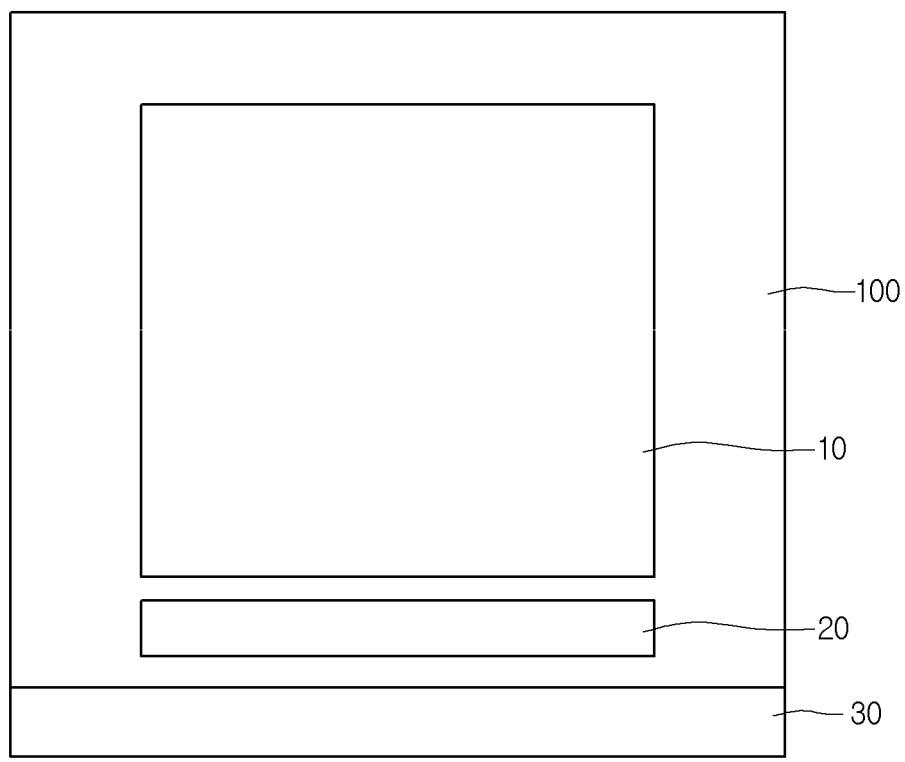
FIG. 1 is a planar view showing an OLED device according to a first embodiment of the present disclosure.

Reference will now be made in detail to embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a planar view showing an OLED device according to a first embodiment of the present disclosure. Referring to FIG. 1, an OLED device according to a first embodiment of the present disclosure includes a substrate 100 defined into a first active area 10, a dummy area 20 and a pad area 30. Although it is not shown in the drawing, the first active area 10 and the dummy area 20 can be sealed by a separated sealing member. As such, an organic emission layer of the OLED device can be protected from external circumstances.

Driving thin film transistors and organic light emitting elements are formed in the first active region 10. If a signal is applied to a gate electrode of the driving thin film transistor, the driving thin film transistor can be turned-on and enable the organic light emitting element to emit light.

The organic light emitting element includes a first electrode, an organic emission layer and a second electrode. The first electrode can be electrically connected to the driving thin film transistor and used as an anode electrode. However, the first electrode is not limited to this. Alternatively, the first electrode can be used as a cathode electrode. Hereinafter, the organic light emitting element using the first electrode as the anode electrode will be described as an example.

A first bank pattern can be formed in such a manner as to overlap with edges of the first electrode and expose an upper surface of the first electrode. Also, a second bank pattern is formed in the first active area in such a manner as to overlap with the first bank pattern. The first bank pattern defines the first active and dummy areas into emission regions and a non-emission region. Such first and second bank patterns can prevent light leakage.

The organic emission layer can be formed to have a multi-layered structure, in order to enhance the luminous efficiency. For example, the organic emission layer can include a hole injection layer HIL, a hole transport layer HTL, an emission material layer EML, an electron transport layer ETL and an electron injection layer EIL. However, the organic emission layer is not limited to this. Alternatively, the organic emission layer can be formed in a single layer structure.

Such an organic emission layer can be formed by jetting or dropping a liquefied organic emission material on the first electrode of the organic light emitting element through one of spin coating, ink-jet and slot die processes, and then hardening the liquefied organic emission material. This forming method of the organic emission layer can be efficiently applied to the manufacture of a large-sized display device, and simplifies a manufacturing procedure of the large-sized display device. The second electrode can be formed by depositing a metal on the organic emission layer. Such a second electrode can be used as a cathode electrode.

The organic emission layer hardens slower in an edge of the first active area 10 compared to the central portion of the first active area 10. As such, an edge of the organic emission layer can be formed thicker than the central portion of the organic emission layer, and deteriorates the aperture ratio of the OLED device. To address this matter, the organic emission layer can be formed up to the dummy area 20 which surrounds the first active area 10.

The organic light emitting elements can also be formed in the dummy area 20. However, the driving thin film transistors are not formed in the dummy area 20. As such, the organic light emitting elements within the dummy area 20 cannot emit any light.

The first bank pattern overlapping with the edges of the first electrode of each organic light emitting element and exposing the upper surface of the first electrode of each organic light emitting element can be formed in the first active area 10 and the dummy area 20. A third bank pattern can be formed on the first bank pattern within the dummy area 20. The third bank pattern can be formed from the same material and in the same layer as the second bank pattern.

Also, the second bank pattern can be formed to have a wider width than that of the third bank pattern. As such, an opening defined by the third bank pattern within the dummy area 20 can be formed larger than another opening defined by the second bank pattern within the first active area 10. Also, the organic emission layer formed in the first active area 10 can have a narrower width (a smaller size) than that of the organic emission layer formed in the dummy layer 20.

In other words, an exposed area of the organic emission layer material on the dummy area 20 is larger than that of the organic emission layer material on the first active area. As such, a hardening speed of the organic emission layer material on the dummy area 20 can become higher. In accordance therewith, the organic emission layer material on the dummy area 20 can be the same hardening speed as the organic emission layer material on the first active area 10.

In this manner, the dummy area 20 substitutes for an edge of the first active area 10 used to emit light. As such, the organic emission layer can be uniformly formed in the whole of the first active area including the edge of the first active area 10. In accordance therewith, brightness of the OLED device can be enhanced.

The dummy area 20 is not limited to that shown in the drawing. Alternatively, the dummy area 20 can be defined in such a manner as to surround all edges of the first active area 10. The pad area 30 can be defined by the outer edge of the dummy area 20. Such a pad area 30 can be electrically connected to an external electronic device, and transfer signals and power voltages received from the external electronic device to the first active area 10.

Such an OLED device of the present disclosure can increase the hardening speed of the organic emission layer material within the dummy area 20 by forming the second bank pattern within the first active area 10 in a larger width compared to that of the third bank pattern within the dummy area 20. As such, the organic emission layer can be uniformly formed in the edges and the central portion of the first active area 10. Therefore, brightness of the OLED device can be enhanced.

Figure 2:
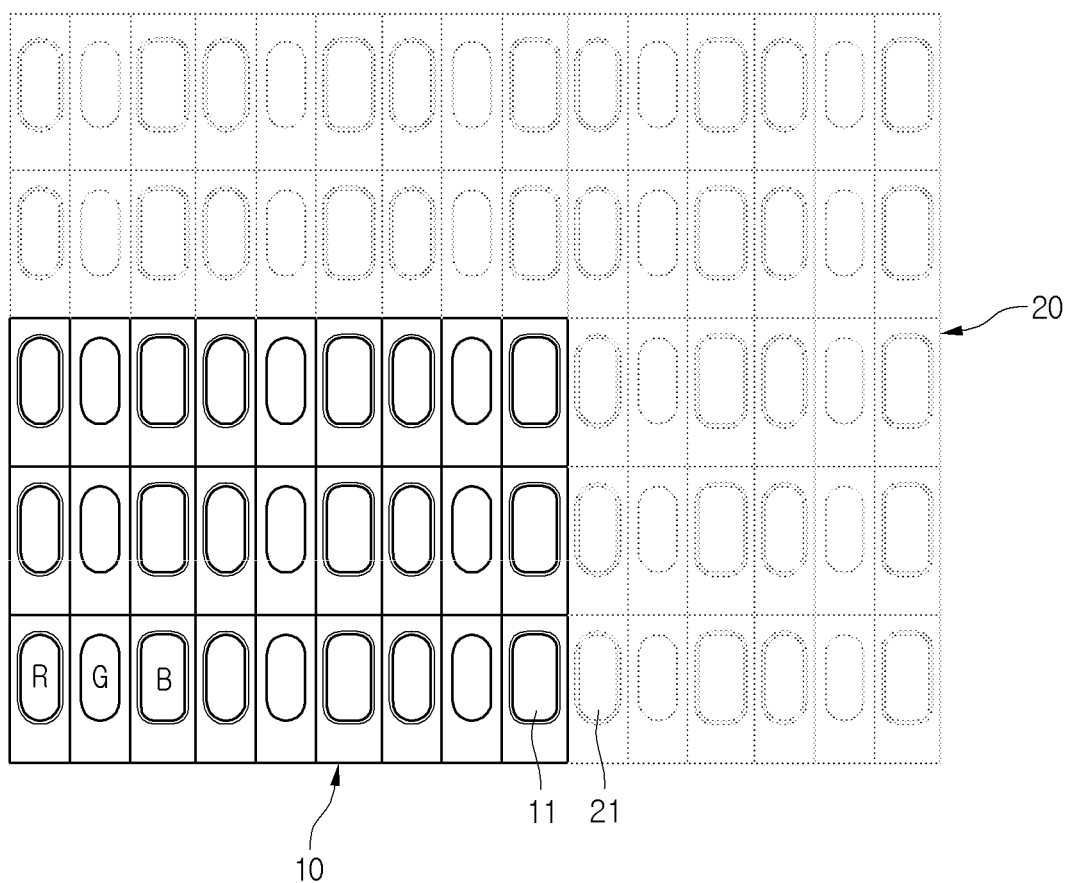
FIG. 2 is a planar view showing another example of active and dummy regions of an OLED device according to a first embodiment of the present disclosure.

Subsequently, another example of the OLED device according to a first embodiment of the present disclosure will be described with reference to FIG. 2. FIG. 2 is a planar view showing another example of active and dummy regions of an OLED device according to a first embodiment of the present disclosure. The OLED device of another example can include the same components as that of the previous example. As such, the components of another example having the same function and shape as those of the previous example will be referred to by the same reference numbers and names. Also, the description of another example overlapping with the previous example will be omitted.

Referring to FIG. 2, the OLED device includes red, green and blue sub-pixels R, G and B 11 arranged in a first active area 10. The red sub-pixel R can be used to emit red light, the green sub-pixel G can be used to emit green light, and the blue sub-pixel B can be used to emit blue light. Also, the OLED device further includes a double layered bank pattern in the first active area 10. The double layered bank pattern can define the first active area into emission regions. Such a double layered pattern can include a first bank pattern and a second bank pattern overlapping with the first bank pattern.

A dummy area 20 of the OLED device can be defined outward the first active area 10. In detail, the dummy area 20 can be defined in such a manner as to surround all edges of the first active area 10. Also, the OLED device includes a plurality of dummy pixels 21 formed in the dummy area 20. Moreover, the OLED device can include a dummy bank pattern formed in the dummy area 20 and configured to define the dummy area 20 into organic light emitting element regions of the dummy pixels 21.

The dummy bank pattern with the dummy area 20 can include the first bank pattern and a third bank pattern overlapping with the first bank pattern. The third bank pattern can be formed from the same material and in the same layer as the second bank pattern.

Such a third bank pattern can be formed to have a narrower width than that of the second bank pattern. As such, an opening defined by the third bank pattern within the dummy area 20 can be formed larger than another opening defined by the second bank pattern within the first active area 10. Also, the organic emission layer formed in the first active area 10 can have a narrower width than that of the organic emission layer formed in the dummy layer 20.

In other words, an exposed area of the organic emission layer material opposite to the dummy area 20 becomes larger than that of the organic emission layer material on the first active area. As such, a hardening speed of the organic emission layer material on the dummy area 20 can become higher. In accordance therewith, the organic emission layer material on the dummy area 20 can have the same hardening speed as the organic emission layer material on the first active area 10.

In this way, the dummy area 20 substitutes for edges of the first active area 10. As such, the organic emission layer can be uniformly formed in the whole of the first active area 10 including the edges of the first active area 10. In accordance therewith, brightness of the OLED device can be enhanced.

Such an OLED device of the present disclosure can enlarge an opening exposing the organic emission layer within the dummy area by forming the second bank pattern within the first active area 10 in a larger width compared to that of the third bank pattern within the dummy area 20. As such, the organic emission layer material on the dummy area 20 can have the same hardening speed as the organic emission layer material on the first active area 10. In accordance therewith, the organic emission layer can be formed to have the same thickness on both the first active area and the dummy area 20. Therefore, brightness of the OLED device can be enhanced.

Figure 3:
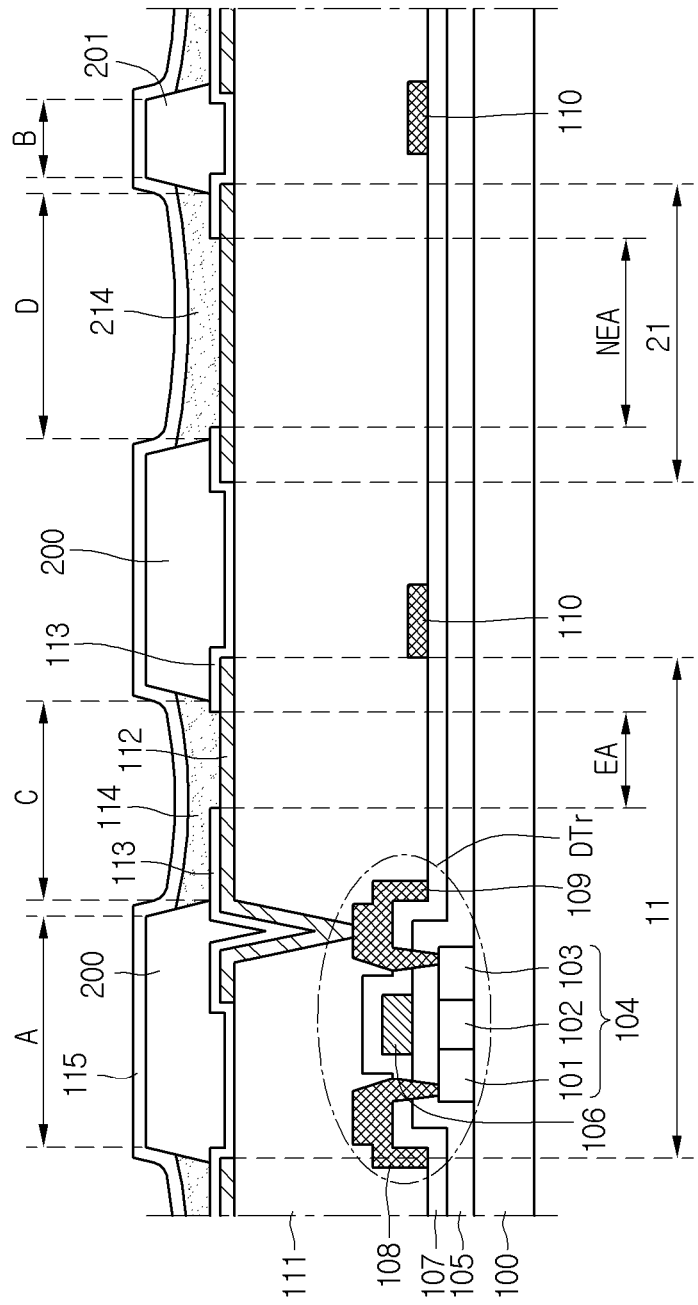
FIG. 3 is a cross-sectional view showing a cross-sectional structure of an OLED device according to a first embodiment of the present disclosure.

Continually, a cross-sectional structure of an OLED device according to a first embodiment of the present disclosure will be described with reference to FIG. 3. FIG. 3 is a cross-sectional view showing a cross-sectional structure of an OLED device according to a first embodiment of the present disclosure. The cross-sectional structure of OLED display device can include the same components as the above-mentioned planar structures. As such, components of the cross-sectional structure having the same function and shape as those of the above-mentioned planar structures will be referred to by the same reference numbers and names. Also, the description of the cross-sectional structure overlapping with the above-mentioned planar structures will be omitted.

Referring to FIG. 3, the OLED display device according to a first embodiment of the present disclosure includes a substrate 100 defined into a first active area 10 and a dummy area 20. Also, the OLED device includes a plurality of sub-pixels 11 formed in the first active area 10 of the substrate 100 and a plurality of dummy pixels 21 formed in the dummy area 20 of the substrate 100.

The sub-pixel 11 within the first active area 10 of the substrate 100 includes a driving thin film transistor DTr and an organic light emitting element 112, 114 and 115 sequentially formed on the substrate 100. The driving thin film transistor DTr included in the sub-pixel 11 within the first active area 10 can be electrically connected to a first electrode 112 of the respective organic light emitting element 112, 114 and 115, and drive the respective organic light emitting element 112, 114 and 115.

The dummy pixel 21 within the dummy area 20 includes a data line 110 and an organic light emitting element 112, 114 and 115. The organic light emitting element 112, 114 and 115 of the dummy pixel 21 is not connected to any driving thin film transistor. As such, the organic light emitting element 112, 114 and 115 of the dummy pixel 21 cannot emit light.

The driving thin film transistor DTr includes a semiconductor layer 104, a gate insulation film 105, a gate electrode 106, a source electrode 108 and a drain electrode 109. The organic light emitting element 112, 114 and 115 includes a first electrode 112, a second electrode 115 formed opposite to the first electrode 112, and an organic emission layer 114 formed between the first electrode 112 and the second electrode 115.

The semiconductor layer 104 is formed on the substrate 10. If the OLED device is a bottom emission type allowing an image to display in a downward direction of the substrate 100, the substrate 100 can be formed from a transparent material. On the contrary, when the OLED device is a top emission type enabling an image to be displayed in an upward direction of the substrate 100, the substrate 100 can be formed from an opaque material not the transparent material. For example, the substrate 100 can be formed from one of ceramic and a metal material.

The semiconductor layer 104 formed in the first active area 10 opposite to the sub-pixel 11 includes a source region 101, a channel region 102 and a drain region 103. The gate insulation film 105 is formed on the entire surface of the substrate 100 provided with the semiconductor layer 104. In detail, the gate insulation film 105 is formed to expand up to the dummy area 20 opposite to dummy pixel 21. Such a gate insulation film 105 can protect the semiconductor layer 104 from the intrusion of impurities.

The gate electrode 106 is formed on the gate insulation film 105 opposite to the sub-pixel 11. The gate electrode 106 can be formed from one selected from a metal group which includes copper Cu, molybdenum Mo, aluminum Al, silver Ag, titanium Ti and alloys thereof. Such a gate electrode 106 can be formed in a single metal layer structure as shown in the drawing. However, the gate electrode 106 can be formed by stacking as least two metal layers, as needed. The gate electrode 106 formed from one of copper Cu, molybdenum Mo, aluminum Al, silver Ag, titanium Ti and alloys thereof can have a low resistance.

An interlayer insulation film 107 is formed on the entire surface of the substrate 100 provided with the gate electrode 106. The interlayer insulation film 107 is formed to expand up to the dummy area 20 opposite to the dummy pixel 21. Such an interlayer insulation film 107 can be used to protect the gate electrode. Also, primary contact holes exposing the source region 101 and the drain region 103 are in the interlayer insulation film 107 and the gate insulation film 106.

Thereafter, the source electrode 108 and the drain electrode 109 separated from each other are formed on the interlayer insulation film 107 provided with the primary contact holes. The source electrode 108 and the drain electrode 109 are connected to the source region 101 and the drain region 103 of the semiconductor layer 104 through the primary contact holes. As such, the source electrode 108 and the drain electrode 109 can be electrically connected to the source region 101 and the drain region 103 of the semiconductor layer 104. In accordance therewith, the driving thin film transistor DTr disposed in the first active area opposite to the sub-pixel 11 can be completed.

Also, a data line 110 can be formed in the dummy area opposite to the dummy pixel 21. The data line 110 can be formed in the same layer as the source electrode 108 and the drain electrode 109. A planarization film 111 can be formed on the entire surface of the substrate 100 provided with the driving thin film transistor DTr and the data line 110. The planarization film 111 can planarize the upper surface of the substrate 100 roughened by the driving thin film transistor DTr.

Although it is not shown in the drawing, a passivation film can further be formed on the entire surface of the substrate 100 provided with the source electrode 108 and the drain electrode 109 before the formation of the planarization film 111. The passivation film can be used to protect the source electrode 108 and the drain electrode 109.

A secondary contact hole exposing the drain electrode 109 of the driving thin film transistor DTr can be formed in the planarization film 111. The first electrodes 112 of the organic light emitting elements each connected to the drain electrode 109 via the secondary contact hole can be formed on the planarization film 111 opposite to the sub-pixel 11 within the first active area 10. At the same time, the first electrode 112 of different organic light emitting element can be formed on the planarization film 111 opposite to the dummy pixel 21 within the dummy area 20.

The first electrode 112 can be formed from a transparent conductive material with a relative high work-function value. For example, the transparent conductive material can have a work function value range of about 4.8 eV~5.2 eV. Also, the transparent conductive material can be a hydrophilic material. Actually, the first electrode 112 can be formed from indium-tin-oxide ITO. In this case, the first electrode 112 can be used as an anode electrode.

If the first electrode 112 is formed from indium-tin-oxide ITO corresponding one of the transparent conductive materials with the high work function value, a reflective layer formed from a metal material with superior reflectance can further be included under the first electrode 112. For example, the reflective layer can be formed from one of aluminum Al and an aluminum alloy AlNd. Such a reflective layer can enhance the luminous efficiency of the organic light emitting element 112, 114 and 115 being driven in a top emission mode.

In detail, the reflective layer formed under the first electrode 112 reflects light emitted from the organic emission layer 114, which is formed on the first electrode 112, in an upward direction. As such, emitted light use efficiency can become higher. Therefore, brightness property of the organic emission layer 114 can be enhanced.

A first bank pattern 113, which overlaps with an edge of the first electrode 112 and exposes a part of the upper surface of the first electrode 112, is formed in a boundary region between the sub-pixel 11 of the first active area 10 and the dummy pixel 21 of the dummy area 20. The first bank pattern 113 can be formed from a hydrophilic inorganic insulation material. For example, the hydrophilic inorganic insulation material can be one of SiO2 and SiNx.

A second bank pattern 200 overlapping with the first bank pattern 113 is formed in the sub-pixel 11 of the first active area 10. The second bank pattern 200 can be formed of a hydrophobic organic material. Also, the second bank pattern 200 can be formed to have a larger thickness and a narrower width compared to the first bank pattern 113. As such, a part (i.e., edges) of the upper surface of the first bank pattern 113 can be exposed by the second bank pattern 200.

A first organic emission layer 114 is formed on the exposed surface of the first electrode 112 within the first active area 10. In detail, the first organic emission layer 114 is formed on the exposed upper-surface of the first electrode 112 and the exposed upper-surface of the first bank pattern 113. Also, the first organic emission layer 114 can be formed in an opening surrounded by the second bank pattern 200.

A region between a first portion of the first bank pattern 113 and a second portion of the first bank pattern 113 being separate from and opposite to the first portion of the first bank pattern 113 can be defined as an emission region EA. Although the width of the emission region EA within the first active area 10 is not limited to that shown in the drawing, the width of the emission region EA with the first active area 10 can be varied when the distance between the first and second portions of the first bank pattern 113 being opposite to and separate from each other. If the distance between the first and second portions of the first bank pattern 113 increases, the width of the emission region EA can be enlarged and furthermore brightness of the organic light emitting element can become higher.

The first organic emission layer 114 can be formed by jetting or dropping a liquefied organic emission material on the first electrode 112 using one of a spin coating method, an ink-jet method and a slot die method, and hardening the liquefied organic emission material on the first electrode. At this time, a thickness increment of an edge of the first organic emission layer 114 adjacent to the bank pattern can be minimized or prevented because the first bank pattern is formed under the second bank pattern 200.

In this way, a hydrophilic organic emission layer can be uniformly formed on the first electrode 112 and the first bank pattern 113 which each have a hydrophilic property. Also, a hydrophobic organic emission layer can be uniformly formed on the hydrophilic organic emission layer. As such, at least two organic emission layers can be uniformly formed without mixing with each other.

A third bank pattern 201 overlapping with the first bank pattern 113 can be formed in the dummy pixel 21 of the dummy area 20. The third bank pattern 201 can be formed from the same material and in the same layer as the second bank pattern 200 which is formed in the sub-pixel 11 of the first active area 10. Also, the third bank pattern 201 can be formed from a hydrophobic organic material.

Such a third bank pattern 201 can be formed to have a larger thickness and a narrower width compared to the first bank pattern 113. Also, the width of the third bank pattern 201 can be smaller than that of the second bank pattern 200. As such, an opening defined by the third bank pattern 201 within the dummy pixel 21 of the dummy area 20 can be formed larger than another opening defined by the second bank pattern 200 within the sub-pixel 11 of the first active area 10.

A second organic emission layer 214 is formed on the first electrode 112 which has an exposed upper surface and is formed in the dummy area 20 opposite to the dummy pixel 21. In detail, the second organic emission layer 214 can be formed on the exposed upper surface of the first electrode 112 and the exposed upper surface of the first bank pattern 113. However, the second organic emission layer 214 cannot emit light because a driving thin film transistor DTr is not formed in the dummy pixel 21. As such, a region between both portions of the first bank pattern 113 being separate from and opposite to each other within the dummy area 20 can be defined as a non-emission region NEA.

Each of the first and second organic emission layers 114 and 214 can be formed in a multi-layered structure, in order to enhance the luminous efficiency. For example, each of the first and second organic emission layer 114 and 214 can include a hole injection layer HIL, a hole transport layer HTL, an emission material layer EML, an electron transport layer ETL and an electron injection layer EIL. Also, the organic emission layer of the multi-layered structure can be formed by forming alternately a hydrophilic organic emission layer and a hydrophobic organic emission layer.

The second organic emission layer 214 can be formed by jetting or dropping a liquefied organic emission material on the first electrode 112 using one of a spin coating method, an ink-jet method and a slot die method, and hardening the liquefied organic emission material on the first electrode.

The emission region EA within the first active area 10 and the non-emission region NEA within the dummy area 20 can have the same width. This results from the fact that a distance between both the portions of the first bank pattern 113 being separate from and opposite to each other with the first active area 10 is the same as another distance between both the portions of the first bank pattern 113 being separate from and opposite to each other with the dummy area 20. Also, the emission region EA and the non-emission region NEA can be formed in the same size.

On the other hand, the third bank pattern 201 included in the dummy pixel 21 of the dummy area 20 is formed in a smaller width than that of the second bank pattern 200 included in the sub-pixel 11 of the first active area 10. As such, an opening formed in the dummy area 20 opposite to the dummy pixel 21 can have a larger size compared to another opening formed in the first active area 10 opposite to the sub-pixel 11. Also, the width C of the first organic emission layer 114 formed in the first active area 10 can be narrower than the width D of the second organic emission layer 214 formed in the dummy area 20.

In other words, the width C of the first organic emission layer 114 formed in the first active area 10 opposite to the sub-pixel 11 can be narrower than the width D of the second organic emission layer 214 formed in the dummy area 20 opposite to the dummy pixel 21. In accordance therewith, the second organic emission layer 214 of the dummy pixel 21 can include a larger quantity of organic emission material compared to the first organic emission layer 114 of the sub-pixel 11.

The organic emission material hardens at a faster speed in an edge portion of the active area rather than the central portion of the active area. Due to this, the related art OLED device must thickly form the organic emission layer in the edge of the active area rather than the other portion of the active area.

However, the OLED device of the present disclosure enables the second organic emission layer 214 of the dummy pixel 21 within the dummy area 20 rather than the first organic emission layer 114 of the sub-pixel 11 with the first active area 10 to include a larger quantity of organic emission material. As such, an organic emission material forming the first organic emission layer 114 of the sub-pixel 11 can be the same hardening speed as that forming the second organic emission layer of the dummy pixel 21.

In accordance therewith, the thickness increment of the first organic emission layer 114 in an edge portion of the first active area 10 can be prevented or minimized. In other words, the dummy area 20 can substitute for an edge portion of the first active area 10. As such, the first organic emission layer 114 can be uniformly formed throughout the first active area 10. Consequently, the first organic emission layer 114 in the first active area opposite to the sub-pixels 11 can be uniformly formed in both the edge and central portions of the first active area 10.

The second electrode 115 is formed on the substrate 100 provided with the first and second organic emission layers 114 and 115 and the second and third bank patterns 200 and 201. The second electrode 115 can be formed from an electrode material with a lower work function value than that of the first electrode 112. For example, the second electrode 115 can be formed from one of lithium Li, calcium Ca, aluminum Al, silver Ag, magnesium Mg and an alloy thereof.

In accordance therewith, the organic light emitting elements each including the first electrode 112, the first organic emission layer 114 and the second electrode 115 are formed in the first active area 10. Also, the organic light emitting elements each including the first electrode 112, the second organic emission layer 214 with a larger width than that of the first organic emission layer 114, and the second electrode 115 are formed in the dummy area 20.

The OLED device of the present disclosure can increase the quantity of organic emission material within the dummy pixel 21 by largely forming the second bank pattern 200 within the first active area 10 rather than the third bank pattern 201 within the dummy area 20 in width. As such, the quantity of the organic emission material forming the third organic emission layer 201 of the dummy pixel 21 can increase. In accordance therewith, an organic emission material forming the first organic emission layer 114 of the sub-pixel 11 can be the same hardening speed as that forming the second organic emission layer 214. Therefore, the first organic emission layer can be uniformly formed in the edges and the central portion of the first active area 10. Furthermore, the aperture ratio of the OLED device can be enhanced.

Figure 4:
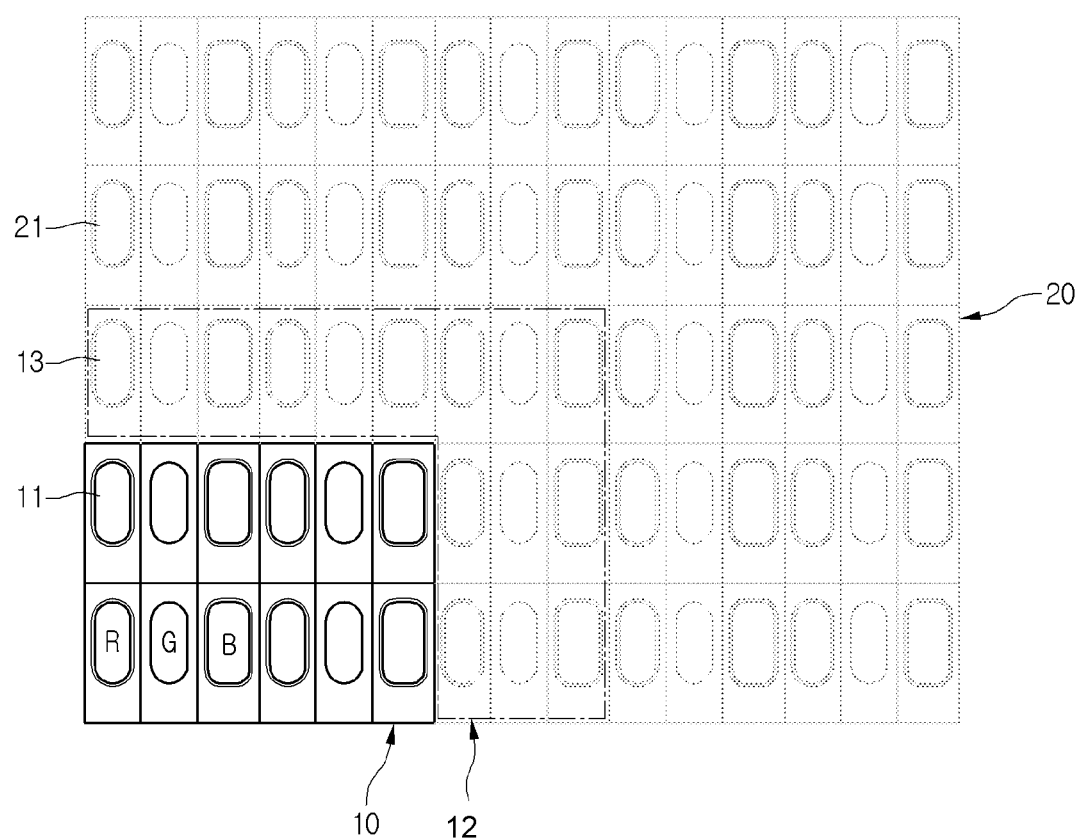
FIG. 4 is a planar view showing active and dummy regions of an OLED device according to a second embodiment of the present disclosure.

Next, an OLED device according to a second embodiment of the present disclosure will be described with reference to FIG. 4. FIG. 4 is a planar view showing active and dummy regions of an OLED device according to a second embodiment of the present disclosure. The OLED display device of the second embodiment can include the same components as that of the previous embodiment. As such, components of the second embodiment having the same function and shape as those of the previous embodiment will be referred to by the same reference numbers and names. Also, the description of the second embodiment overlapping with the previous embodiment will be omitted.

Referring to FIG. 4, the OLED device according to second embodiment of the present disclosure is defined into a first active area 10, a second active area 12 and a dummy area 20. The second active area 12 can be defined in a rectangular loop shape of surrounding the first active area 10. The dummy area 20 can be defined in a rectangular loop shape of surrounding the second active area 12.

The OLED device includes red, green and blue sub-pixels R, G and B arranged in the first and second active areas 10 and 12. The red sub-pixel R can be used to emit red light, the green sub-pixel G can be used to emit green light, and the blue sub-pixel B can be used to emit blue light. In other words, a plurality of sub-pixels 11 and 13 can be formed in the first and second active areas 10 and 12.

Also, the OLED device further includes a double layered bank pattern formed in the first and second active areas 10 and 12. The double layered bank pattern can define the first and second active areas 10 and 12 into emission regions of the sub-pixels 11 and 13. The double layered pattern within the first active area 10 can include a first bank pattern and a second bank pattern overlapping with the first bank pattern and having a first width.

The double layered pattern within the second active area 10 can include the first bank pattern and a third bank pattern which overlaps with the first bank pattern and has a second width. The third bank pattern can be formed in the same layer and from the same material as the second bank pattern.

The third bank pattern within the second active area 12 can be formed to have a smaller width than that of the second bank pattern within the first active area 10. The OLED device further includes a plurality of dummy pixels formed in the dummy area 20 which is defined in a rectangular loop shape of surrounding the second active area 12.

Moreover, the OLED device includes another double layered bank pattern formed in the dummy areas 20. The double layered bank pattern within the dummy area 20 can define the dummy area 20 into non-emission regions of the dummy pixels 21. The double layered pattern within the dummy area 20 can include the first bank pattern and the third bank pattern which overlaps with the first bank pattern and has the second width.

An opening defined by the third bank pattern within the second active area 12 and the dummy area 20 can have a larger size compared to another opening defined by the second bank pattern within the first active area 10. As such, an exposed area (or size) of an organic emission layer material which will be formed in the second active area 12 and the dummy area 20 can be enlarged. In accordance therewith, the hardening speed of an organic emission layer material which will be coated in the second active area 12 and the dummy area 20 can become higher. Therefore, the organic emission layer material in the second active area 12 and the dummy area 20 can have the same hardening speed as that in the first active area 10.

In other words, the second active area 12 and the dummy area 20 substitute for edge portions of the first active area 10. As such, the organic emission layer can be uniformly formed in the whole of the first active area 10 including the edge portions of the first active area 10. In accordance therewith, brightness of the OLED device can be enhanced.

Also, the third bank pattern formed in the second active area 12 and the dummy area 20 can have a smaller width than that of the second bank pattern formed in the first active area 10. As such, the hardening speed of the organic emission layer material within the second active area 12 and the dummy area 20 can become higher. Therefore, the organic emission layer can be uniformly formed throughout the first and second active areas 10 and 12 and the dummy area 20.

Such an OLED device according to a second embodiment of the present disclosure can enlarge an opening exposing the organic emission layer within the second active area 12 and the dummy area 20 by largely forming the second bank pattern within the first active area 10 rather than the third bank pattern within the second active area 12 and the dummy area 20. As such, the organic emission layer material in the second active area 12 and the dummy area 20 can have the same hardening speed as the organic emission layer material in the first active area 10. In accordance therewith, the organic emission layer can be formed to have the same thickness in the first and second active areas 10 and 12 and the dummy area 20. Therefore, brightness of the OLED device can be enhanced.

In other words, the third bank pattern within the second active area 12 and the dummy area 20, which surround the first active area 10, can be formed to have a smaller width than that of the second bank pattern within the first active area 10. As such, the size of the opening exposing the organic emission layer within the second active area 12 and the dummy area 20 can be enlarged. In accordance therewith the organic emission layer material can be solidified at the same hardening speed in the first and second active areas 10 and 12 and the dummy area 20. Therefore, the organic emission layer can be uniformly formed throughout the first and second active areas 10 and 12 and the dummy area 20. Furthermore, brightness of the OLED device can be enhanced.

Figure 5:
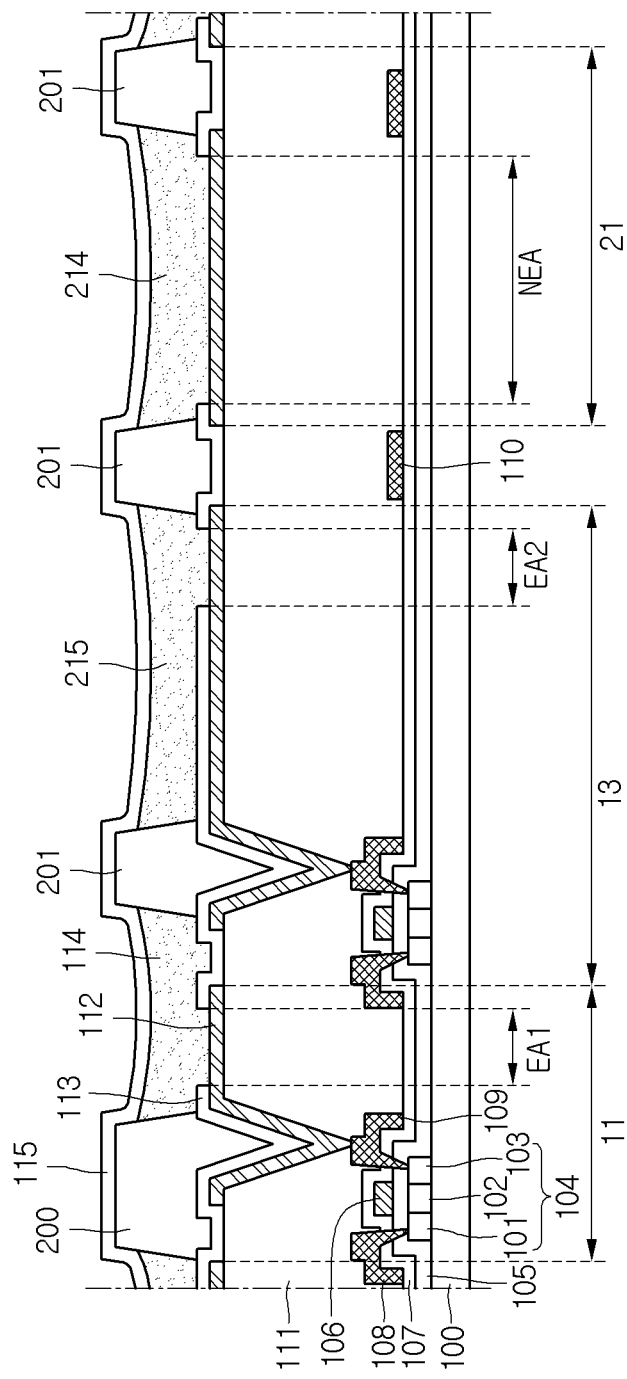
FIG. 5 is a cross-sectional view showing a cross-sectional structure of an OLED device according to a second embodiment of the present disclosure.

Finally, a cross-sectional structure of an OLED device according to a second embodiment of the present disclosure will be described with reference to FIG. 5. FIG. 5 is a cross-sectional view showing an OLED device according to a second embodiment of the present disclosure. The OLED display device of the second embodiment can include the same components as that of the previous embodiment. As such, components of the second embodiment having the same function and shape as those of the previous embodiment will be referred to by the same reference numbers and names. Also, the description of the second embodiment overlapping with the previous embodiment will be omitted.

Referring to FIG. 5, the OLED display device according to a second embodiment of the present disclosure includes a substrate 100 defined into a first active area 10, and a second active area 12 and a dummy area 20. The second active area 12 is defined between the first active area 10 and the dummy area 20. Also, the OLED device includes a plurality of sub-pixels 11 and 13 formed in the first and second active areas 10 and 12 of the substrate 100, and a plurality of dummy pixels 21 formed in the dummy area 20 of the substrate 100. The first and second active areas 10 and 12 are defined into a plurality of emission regions, and the dummy area 20 is defined into a plurality of non-emission regions.

Each of the sub-pixels 11 within the first and second active areas 10 and 12 of the substrate 100 includes a driving thin film transistor DTr and an organic light emitting element sequentially formed the substrate 100. The driving thin film transistor DTr included in each of the sub-pixels 11 and 13 within the first and second active areas 10 and 12 can be electrically connected to a first electrode 112 of the respective organic light emitting element, and drive the respective organic light emitting element 112, 114 and 115.

The dummy pixel 21 within the dummy area 20 includes a data line 110 and an organic light emitting element. The organic light emitting element of the dummy pixel 21 is not connected to any driving thin film transistor. As such, the organic light emitting element of the dummy pixel 21 cannot emit light.

The driving thin film transistor DTr includes a semiconductor layer 104, a gate insulation film 105, a gate electrode 106, a source electrode 108 and a drain electrode 109. The organic light emitting element includes a first electrode 112, a second electrode 115 formed opposite to the first electrode 112, and an organic emission layer 114 or 214 formed between the first electrode 112 and the second electrode 115.

The data line 110 can be formed in the same layer as the source electrode 108 and the drain electrode 109. A planarization film 111 can be formed on the entire surface of the substrate 100 provided with the driving thin film transistor DTr and the data line 110. A contact hole exposing the drain electrode 109 of the driving thin film transistor DTr can be formed in the planarization film 111.

The first electrodes 112 of the organic light emitting elements each connected to the drain electrode 109 via the contact hole can be formed on the planarization film 111 opposite to the sub-pixels 11 and 13 within the first and second active areas 10 and 12. At the same time, the first electrodes 112 of different organic light emitting elements can be formed on the planarization film 111 opposite to the dummy pixel 21 within the dummy area 20.

The first electrode 112 can be formed from a transparent conductive material. The transparent conductive material can be a hydrophilic material. Actually, the first electrode 112 can be formed from indium-tin-oxide ITO. In this case, the first electrode 112 can be used as an anode electrode.

If the first electrode 112 is formed from one of the transparent conductive materials, a reflective layer formed from a metal material with superior reflectance can further be included under the first electrode 112. For example, the reflective layer can be formed from one of aluminum Al and an aluminum alloy AlNd. Such a reflective layer can enhance the luminous efficiency of the organic light emitting element 112, 114 and 115 being driven in a top emission mode.

In detail, the reflective layer formed under the first electrode 112 reflects light emitted from the organic emission layer 114, which is formed on the first electrode 112, in an upward direction. As such, the emitted light use efficiency can become higher. Therefore, brightness property of the organic emission layer 114 can be enhanced.

A first bank pattern 113, which overlaps with an edge of the first electrode 112 and exposes a part of the upper surface of the first electrode 112, is formed in a boundary regions between the sub-pixel 11 of the first active area 10, the sub-pixel 13 of the second active area 12 and the dummy pixel 21 of the dummy area 20. The first bank pattern 113 can be formed from a hydrophilic inorganic insulation material. For example, the hydrophilic inorganic insulation material can be one of SiO2 and SiNx.

A second bank pattern 200 overlapping with the first bank pattern 113 is formed in the sub-pixel 11 of the first active area 10. The second bank pattern 200 can be formed a hydrophobic organic material. Also, the second bank pattern 200 can be formed to have a larger thickness and a smaller width compared to the first bank pattern 113. As such, a part (i.e., edges) of the upper surface of the first bank pattern 113 can be exposed by the second bank pattern 200.

A first organic emission layer 114 is formed on the exposed surface of the first electrode 112 within the first active area 10. In detail, the first organic emission layer 114 is formed on the exposed upper-surface of the first electrode 112 and the exposed upper-surface of the first bank pattern 113. In other words, the first organic emission layer 114 can be formed into an opening defined by the second bank pattern 200. A region between a first portion of the first bank pattern 113 and a second portion of the first bank pattern 113 being separate from and opposite to the first portion of the first bank pattern 113 can be defined as a first emission region EA1.

A third bank pattern 201 overlapping with the first bank pattern 113 is formed in the sub-pixel 13 of the second active area 12. The third bank pattern 201 can be formed in the same layer and from the same material as the second bank pattern 200. The third bank pattern 201 can be formed a hydrophobic organic material. A second organic emission layer 215 is formed on the exposed surfaces of the first electrode 112 and the first bank pattern 113 within the second active area 12. In other words, the second organic emission layer 215 can be formed into an opening defined by the third bank pattern 201. In the second active area 12, a region between a first portion of the first bank pattern 113 and a second portion of the first bank pattern 113 being separate from and opposite to the first portion of the first bank pattern 113 can be defined as a second emission region EA2.

Although the widths of the first and second emission regions EA1 and EA2 within the first and second active areas 10 and 12 are not limited to those shown in the drawing, the widths of the first and second emission regions EA1 and EA2 within the first and second active areas 10 and 12 can be varied when the distance between the first and second portions of the first bank pattern 113 being opposite to and separate from each other. If the distance between the first and second portions of the first bank pattern 113 increases, the widths of the first and second emission regions EA1 and EA2 can be enlarged and furthermore brightness of the organic light emitting element can become higher.

The third bank pattern 201 can be formed to have a larger thickness and a smaller width compared to the first bank pattern 113. Also, the width of the third bank pattern 201 can be smaller than that of the second bank pattern 200.

The first active area 10 and the second active area 12 can include thin film transistors and emission regions. However, the third bank pattern 201 within the second active area 12 is formed to have a smaller width than that of the second bank pattern 200 within the first active area 10. As such, the organic emission layer 114 and 215 formed into the openings, which are defined by the bank patterns, can be planarized in both the first and second active areas 10 and 12.

The third bank pattern 201 can be formed in the dummy pixel of the dummy area 20 in such a manner as to overlap with the first bank pattern 113. The third bank pattern 201 can be formed from a hydrophobic organic material.

A second organic emission layer 214 is formed on the first electrode 112 which have an exposed upper surface and is formed in the dummy area 20 opposite to the dummy pixel 21. In detail, the second organic emission layer 214 of the dummy pixel 21 can be formed on the exposed upper surface of the first electrode 112 and the exposed upper surface of the first bank pattern 113. However, the second organic emission layer 214 of the dummy pixel 21 cannot emit light because any driving thin film transistor DTr is not formed in the dummy pixel 21. As such, a region between both portions of the first bank pattern being separate from and opposite to each other within the dummy area 20 can be defined as a non-emission region NEA.

The emission region EA within the first active area 10 and the non-emission region NEA within the dummy area 20 can have the same width. On the other hand, the third bank pattern 201 included in the dummy pixel 21 of the dummy area 20 and the sub-pixel 13 of the second active area 12 is formed in a smaller width than that of the second bank pattern 200 included in the sub-pixel 11 of the first active area 10. As such, openings formed to receive the second organic emission layer 214/215 in the dummy area 20 opposite to the dummy pixel 21 and the second active area 12 opposite to the sub-pixel 13 can have a larger size compared to the other opening formed in the first active area 10 opposite to the sub-pixel 11.

In other words, the width of the first organic emission layer 114 formed in the first active area 10 opposite to the sub-pixel 11 can become narrower compared to the second organic emission layers 214/215 formed in the dummy area 20 opposite to the dummy pixel 21 and the second active area 12 opposite to the sub-pixel 13. In accordance therewith, a larger quantity of organic emission layer material can be injected into the dummy pixel of the dummy area 20 and the sub-pixel 13 of the second active area 12 rather than the sub-pixel 11 of the first active area 10.

The first and second organic emission layers 114 and 214/215 can be formed by jetting or dropping a liquefied organic emission material on the first electrode 112 using one of a spin coating method, an ink-jet method and a slot die method, and hardening the liquefied organic emission material on the first electrode.

The organic emission layers 114 and 214/215 can be formed in a multi-layered structure, in order to enhance the luminous efficiency. For example, the organic emission layers 114 and 214/215 can include a hole injection layer HIL, a hole transport layer HTL, an emission material layer EML, an electron transport layer ETL and an electron injection layer EIL. Also, the organic emission layer 114 and 214/215 of the multi-layered structure can be formed by forming alternately a hydrophilic organic emission layer and a hydrophobic organic emission layer.

In this way, a hydrophilic organic emission layer can be uniformly formed on the first electrode 112 and the first bank pattern 113 which each have a hydrophilic property. Also, a hydrophobic organic emission layer can be uniformly formed on the hydrophilic organic emission layer. As such, at least two organic emission layers can be uniformly formed without mixing with each other.

Also, the third bank pattern 201 included in the dummy pixel 21 of the dummy area 20 and the sub-pixel 13 of the second active area 12 is formed in a smaller width than that of the second bank pattern 200 included in the sub-pixel 11 of the first active area 10. In accordance therewith, the thickness increment of the second organic emission layer 214/215 in the second active area 12 and the dummy area 20, which correspond to an edge of the first active area 10, can be prevented or minimized.

The second electrode 115 is formed on the substrate 100 provided with the first and second organic emission layers 114 and 214/215 and the second and third bank patterns 200 and 201. The second electrode 115 can be formed from one of lithium Li, calcium Ca, aluminum Al, silver Ag, magnesium Mg and an alloy thereof.

In accordance therewith, the organic light emitting elements which each include the first electrode 112, the first organic emission layer 114 and the second electrode 115, together the thin film transistors are formed in the first active area 10. Also, the organic light emitting elements which each include the first electrode 112, the second organic emission layer 215 with a larger width than that of the first organic emission layer 114, and the second electrode 115, together with the thin film transistor are formed in the second active area 12. Moreover, the organic light emitting elements, which each include the first electrode 112, the second organic emission layer 214 and the second electrode 115, together the thin film transistors are formed in the first active area 10.

In this manner, the third bank pattern 201 is formed up to the second active area 12 which is defined into the emission regions. The opening formed to receive the second organic emission layer 215 within the second active area 12 can be enlarged. Therefore, the organic emission layer can be uniformly formed in all of the first and second active areas 10 and 12 and the dummy area 20.

In the OLED device of the present disclosure, an organic bank pattern formed in the first active area 10 opposite to the sub-pixel 11 has a smaller width compared to another organic bank pattern formed in the second active area 12 and dummy area 20, which doubly surround the first active area 10, opposite to the sub-pixel 13 and the dummy pixel 21. As such, the size of the opening exposing the organic emission layer within the second active area 12 and the dummy area 20 can be enlarged. In accordance therewith, the hardening speed of the organic emission layer material within the second active area 12 and the dummy area 20 can become higher. Therefore, the organic emission layer can be uniformly formed in all of the first active area 10 opposite to the sub-pixel 11, the second active area 12 opposite to the sub-pixel 13 and the dummy area 20 opposite to the dummy pixel 21. In other words, the organic emission layer of the OLED device can be evenly formed.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic light emitting display device comprising:
a substrate including a first active area and a dummy area;
a plurality of first electrodes on the substrate;
a first bank pattern overlapping edges of each first electrode and exposing a part of an upper surface of each first electrode;
a second bank pattern on the first bank pattern within the first active area;
a third bank pattern on the first bank pattern within the dummy area in the same layer as the second bank pattern;
a first organic emission layer on an exposed upper surface of the first electrode within the first active area;
a second organic emission layer on the exposed surface of the first electrode within the dummy area, wherein the second organic emission layer covers a larger area of the first electrode than the first organic emission layer; and
a second electrode on the second and the third bank patterns and the first and the second organic emission layers,
wherein a first opening in the first active area defined by the first bank pattern is smaller than a second opening in the dummy area defined by the third bank pattern.

2. The display device of claim 1, wherein the second bank pattern has a width smaller than that of the first bank pattern but larger than that of the third bank pattern.

3. The display device of claim 1, wherein the substrate includes a second active area between the first active area and the dummy area, wherein a third opening in the second active area is larger than the first opening.

4. The display device of claim 3, wherein the third bank pattern defines the third opening for the second active area.

5. The display device of claim 4, wherein the first organic emission layer has a smaller width than a third organic emission layer in the second active area and the second organic emission layer in the dummy area.

6. The display device of claim 3, wherein the first and the second active areas include thin film transistors and emission regions.

7. The display device of claim 1, wherein the dummy area includes non-emission regions.

8. The display device of claim 1, wherein the first and the second organic emission layers consist of a hardened liquefied organic emission material.

9. An organic light emitting display device comprising:
a substrate including an active area and a dummy area;
a first bank pattern on the substrate;
a second bank pattern on the first bank pattern and defining a first opening in the active area;
a third bank pattern on the first bank pattern and a second opening in the dummy area; and
an organic emission layer in the first and the second openings,
wherein the first opening in the active area has a smaller size than the second opening in the dummy area.

10. The display device of claim 9, wherein the second bank pattern has a width smaller than that of the first bank pattern but larger than that of the third bank pattern.

11. The display device of claim 9, wherein the substrate includes a second active area between the first active area and the dummy area, and
wherein the first and the second active areas include thin film transistors and emission regions.

12. The display device of claim 9, wherein the first and the second organic emission layers consist of a hardened liquefied organic emission material.

13. The display device of claim 9, wherein the second and the third bank patterns consist of the same material.

14. The display device of claim 9, wherein the first bank pattern and the organic emission layer are formed with hydrophilic materials, and the second and the third bank patterns are formed with hydrophobic materials.

* * * * *